United States Patent [19]
Hsu et al.

[11] Patent Number: 5,726,459
[45] Date of Patent: Mar. 10, 1998

[54] GE-SI SOI MOS TRANSISTOR AND METHOD OF FABRICATING SAME

[75] Inventors: Sheng Teng Hsu; Tatsuo Nakato, both of Vancouver, Wash.

[73] Assignees: Sharp Microelectronics Technology, Inc., Cupertino, Calif.; Sharp Kabushiki Kaisha, Osaka, Japan

[21] Appl. No.: 258,518

[22] Filed: Jun. 10, 1994

Related U.S. Application Data

[63] Continuation of Ser. No. 49,735, Apr. 19, 1993, abandoned.
[51] Int. Cl.$^6$ .................. H01L 29/04; H01L 31/036; H01L 31/0376; H01L 31/20
[52] U.S. Cl. .................. 257/55; 257/63; 257/65; 257/66
[58] Field of Search .................. 257/55, 63, 65, 257/66, 347

[56] References Cited

U.S. PATENT DOCUMENTS 4,740,829   4/1988   Nakagiri et al. .................. 257/65
5,475,244   12/1995  Koizumi .................. 257/192

FOREIGN PATENT DOCUMENTS 58-33871   2/1983   Japan .................. 257/66

OTHER PUBLICATIONS

IBM Tech Disc Bulletin, vol. 35 No. 2, Jul. 1992, pp. 468–469.

*Primary Examiner*—Stephen Meier
*Attorney, Agent, or Firm*—Fliesler, Dubb, Meyer & Lovejoy

[57] ABSTRACT

A Ge—Si MOS transistor for high speed, high density applications in which a thin layer of silicon (Si) is doped to have a concentration of germanium (Ge) ions which is preferably between 10 and 30%. The germanium doped silicon is formed on a layer or substrate of insulator. Optional silicidation of the drain and source regions improves conductivity therein and the use of shallow SIMOX processing technologies results in a more cost-effective and rapid fabrication process.

33 Claims, 2 Drawing Sheets

2

GE-SI SOI MOS TRANSISTOR AND METHOD OF FABRICATING SAME

This application is a continuation of Ser. No. 08/049,735 filed Apr. 19, 1993, now abandoned.

BACKGROUND OF THE INVENTION

1. Technical Field

The present invention relates to MOS semiconductor devices and fabrication processes therefor. More specifically, the present invention relates to increasing frequency in MOS transistors.

2. Description of the Related Art

As is well known, the transistor is the basic building block of electronic circuits. For example, the simple 7402 family of NOR gates utilizes 7 or 8 transistor per NOR gate. A standard D-latch may have more than 20 transistors. And one cell of static random access memory has approximately 6 transistors, which means that a chip of 4 K SRAM has 4096×6 or 24, 576 transistors. In addition, current fabrication processes are entering ultra large scale integration which is defined as over 10,000,000 transistors per integrated circuit or "chip." Given their high frequency of use and the large number of transistors implicated with each use, a long time industry goal has been to reduce the size of individual transistors and to increase their speed or "operating frequency."

The maximum operating frequency is given by:

$$f_m = \frac{\omega_m}{2\pi} = \frac{g_m}{2\pi C_{in}} \approx \frac{\mu E}{2\pi L}$$

where μ is the current carrier (electron and/or hole) mobility, L is the channel length, and E is the field intensity in the conducting channel. *Physics of Semiconductor Devices*, S.M. Sze, Chapter 8, p.454. To increase the maximum operating frequency the current carrier mobility and the field intensity must be large and the channel length of the device has to be small. Therefore, the maximum operating frequency of a short channel MOS transistor is larger than that of a long channel device. The above equation also indicates that the larger the current carrier (electron and/or hole) mobility, μ, the higher the maximum operating frequency of the device will be. Thus a semiconductor with larger electron and/or hole mobility is preferred for high speed integrated circuit fabrication.

It has been recognized that the addition of a specific amount of germanium dopant impurities in a silicon substrate increases channel mobility, the mobility of electrons (or holes) in the channel regions, over that of pure silicon. Implementing a Ge—Si substrate in the transistor is achieved by forming the substrate of silicon doped with 10–20% germanium ions. The 10–20% is a percentage known in the art to provide high electron mobility without significantly altering other substrate properties.

Another factor related to operating frequency is parasitic capacitance. Parasitic capacitance due to the source and drain junctions is proportional to the area of those junctions, following the equation:

$$C_j = \frac{\epsilon A_j}{W_d}$$

where $A_j$=source or drain junction area, $W_d$=junction depletion width, and $\epsilon$=effective dielectric constant.

Therefore, reductions in junction area result in reduced junction capacitance. $C_j$ can also be reduced by decreasing $\epsilon$ by using an insulator such as oxide instead of silicon junctions for isolation, and by increasing $W_d$ by forming the active regions on a thick layer of insulator.

SUMMARY OF THE INVENTION

Accordingly, it is an object of the present invention to reduce channel resistance in a high speed MOS transistor.

It is another object of the present invention to increase the electron and hole mobility of the conducting channel in a high speed MOS transistor.

It is yet another object of the present invention to reduce parasitic capacitance in a high speed MOS transistor.

And it is still another object of the present invention to produce a high speed MOS transistor in a cost-effective manner.

These and related objects of the present invention can be achieved by practice of the Ge—Si SOI MOS transistor and method of fabricating same herein disclosed. A Ge—Si SOI MOS transistor in accordance with the present invention utilizes a thin silicon (Si) layer doped with germanium (Ge) ions. The conducting channel is formed in this layer and hence the high electron and hole mobility of the germanium doped silicon is imparted to the channel region, significantly reducing the current carrier transit time therein.

In addition, a silicon-on-insulator (SOI) or more aptly stated a germanium doped silicon on insulator structure is utilized. Such a structure has the increased electron and hole mobility of Ge doped Si and reduced parasitic capacitance brought about by its fabrication on insulator. The reduction in parasitic capacitance lends to a reduction in a time constant, τ, formed by a combination of source and drain parasitics and defined as $C_{d,s}(R_d+R_s)$, where d and s stand for drain and source, respectively.

Resistivity in the source and drain regions may be further reduced by forming the source and/or drain regions of a metal and semiconductor compound, such as a refractory metal and silicon to form silicide, or in the present case, germanium silicide.

Another aspect of the present invention is that it may be implemented using shallow SIMOX techniques as taught below. Shallow SIMOX techniques permit transistor fabrication using less power than in conventional processing and produce desired results in appreciably less time. Furthermore, shallow SIMOX permits the utilization of silicon wafers as a starting material, which are low cost and abundant in supply.

BRIEF DESCRIPTION OF THE DRAWINGS

The invention will be better understood by reference to the figures of the drawings wherein like numbers denote like parts throughout.

DETAILED DESCRIPTION

The present invention overcomes the problems associated with the prior art, particularly in the field of ultra large scale integration (ULSI), by enhancing channel mobility and by reducing both parasitic resistance and parasitic capacitance. To facilitate a better understanding of the present invention, a detailed description is now presented in which the fabricated semiconductor structure 100 is described first, followed by a description of the process used to fabricate such a transistor structure.

Figure 7:
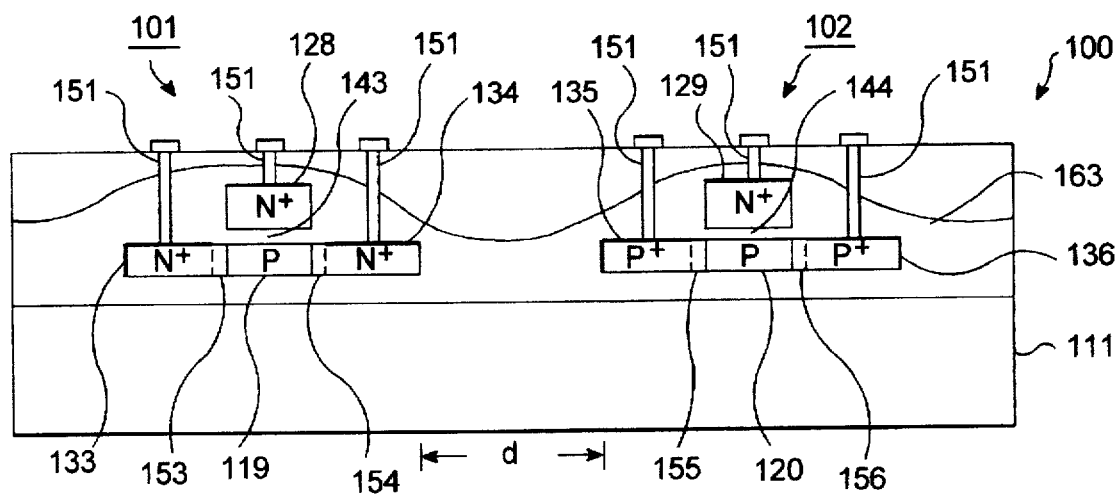
FIG. 7 illustrates a completed Ge—Si SOI MOS transistor fabricated by the process steps illustrated in FIGS. 1–6.

Referring to FIG. 7, a cross-sectional view of a structure 100 in accordance with the present invention is shown. The structure 100 is presented in a CMOS arrangement which is, by definition, comprised of at least two complementary transistor types: an NMOS transistor 101 and a PMOS transistor 102. The CMOS arrangement 100 has been selected in presenting the present invention to illustrate that its' teaching is applicable to both NMOS and PMOS devices.

Each of the NMOS and PMOS transistors 101, 102 is fabricated using SOI processing techniques. The resultant structure consists of a layer of semiconductor material, which is preferably silicon, formed on a layer or substrate of insulator material.

Resistance in the channel region is reduced by doping the layer of silicon on insulator with germanium dopant impurities. A range of 10 to 30% germanium is preferable, but the present invention is not limited to this range. The present invention is intended to include the use of germanium in any concentration to increase mobility.

A reduction in the parasitic resistance of the structure 100 and the resultant time constant, τ, may be achieved by metallizing the source and drain regions 133–136 in which refractory metal is distributed therein. The refractory metal enhances conductivity in the source and drain regions.

The transistors 101 and 102 are fabricated using shallow SIMOX (silicon implanted oxygen) techniques to reduce fabrication costs associated with power consumption, processing overhead and raw materials and to take advantage of the high availability of silicon substrates.

After completion of the fabrication processes, the active components of transistors 101 and 102 (as shown in FIG. 7) are surrounded by insulator, in this case, silicon oxide 163. A minimum safe distance, d, between transistors at present standards is approximately 0.3 microns.

The active components in the NMOS or n-channel transistor 101 include the source and drain regions 133, 134, the conducting channel region 119, the gate electrode 128 and gate oxide 143. Lightly doped regions 153–156 may also be provided as described below. The PMOS or p-channel transistor 102 has the same active components: the source and drain regions 135, 136, the conducting channel regions 120, the gate electrode 129 and gate oxide 144. Interconnects 151 may be provided as shown, however, it is important to note that the arrangement of interconnects 151 may vary depending on the application for which the transistor will be used.

The gate electrodes 128, 129 are N+ doped polysilicon. The use of polysilicon is preferred, but there are several other suitable gate materials. These include, but are not limited to: N+ polycide, P+ polysilicon, P+ polycide, refractory metal and refractory metal silicide, etc. The selection of the source on the left and the drain on the right is arbitrary. The Ge—Si SOI transistors 101 and 102 may be implemented for operation in the enhancement or depletion modes as is known in the art. A fabrication process for fabricating the arrangement or structure 100 of FIG. 7 is now presented.

Figure 1:
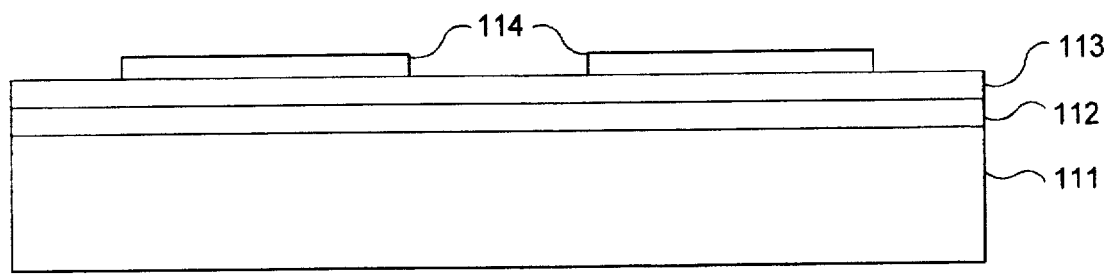
FIGS. 1–6 illustrate process steps in the fabrication of a Ge—Si SOI MOS transistor.

Referring to FIG. 1, a cross-sectional view of a starting wafer is shown. The starting wafer contains a substrate 111 of semiconductor material, preferably silicon. A layer of insulator 112 overlays the silicon substrate 111 and a layer of silicon 113 overlays the insulator 112 to form a silicon on insulator substrate.

Such a substrate is available commercially or may be fabricated as now taught. The structure of FIG. 1 is preferably generated using cost effective shallow SIMOX technology. Shallow SIMOX permits the utilization of readily available silicon substrates and has the additional benefit of being a low energy operation.

To form a substrate as shown in FIG. 1, an oxygen ion dose of approximately $1\times10^{17}$ to $5\times10^{17}$ ions/cm$^2$ is implanted into the silicon substrate 111. This oxygen ion implantation can be done with a low energy, high current (5 to 20 mA) ion implanter. The wafer is then annealed at a temperature preferably between 1300° C. and 1400° C. for 1 to 3 hours to form a buried silicon dioxide layer 112 of about 50 to 60 nm in vertical thickness. The vertical thickness of the top silicon crystal layer 113 is also approximately 50 to 60 nm. Germanium ions are then implanted at low energy into the top silicon layer 113 to obtain a dose of approximately 10 to 30% germanium in silicon.

A preferable germanium ion dose to achieve this result is in the range of $1\times10^{15}$ to $1\times10^{17}$ ions/cm$^2$, which can be readily implanted with a low energy, high current implanter designed for high throughput oxygen implantation. The wafer is preferably annealed to cure implant-induced defects in the chrystal structure of the silicon layer 113 and thus produce a finished germanium doped silicon SOI wafer. The Ge—Si layer can also be deposited using a CVD process.

In a first step after forming, or otherwise obtaining, the wafer of FIG. 1, photoresist 114 is applied and a plasma etch undertaken to define the Ge—Si islands that will form the n-channel and p-channel MOS transistors 101 and 102. The photoresist 114 is then stripped.

Figure 2:
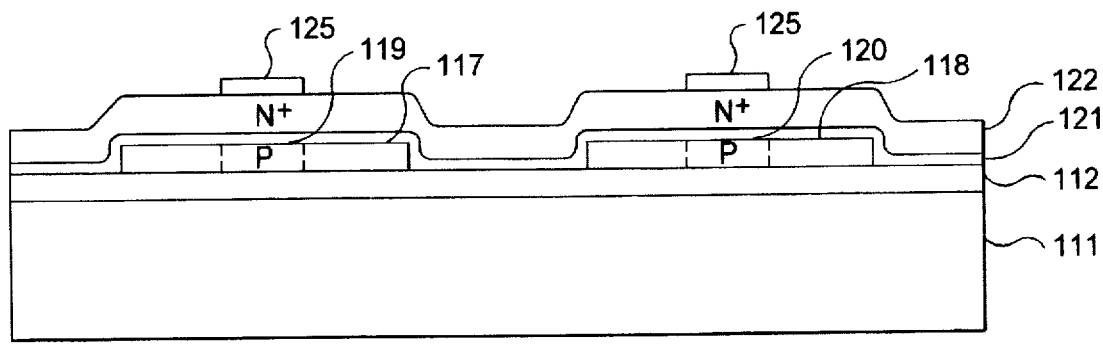

Referring to FIG. 2, after the plasma etch, a first and a second Ge—Si island 117 and 118 are formed. Threshold adjustment is now performed to establish a threshold voltage level in what will be the channel regions 119 and 120 of the n-channel and p-channel transistor 101 and 102, respectively, of FIG. 8. Selecting island 117 to be a subsequent n-channel device, boron ions are implanted into the island 117 while the island 118 is protected by photoresist. A suitable ion dose is in the order of $10^{22}$ ions/cm$^2$ depending on the desired thickness of gate oxide and the thickness of the Ge—Si layer. The island 117 is then covered with photoresist and a boron ion implantation is made into island 118 to adjust a threshold voltage in what will be the p-channel MOS transistor. The boron ion dose for this implantation is in the order of $1\times10^{11}$ to $10^{12}$ ions/cm$^2$ depending on the thickness of gate oxide and the thickness of the Ge—Si layer as known in the art.

In a next step, a layer of oxide 121 of approximately 5 to 12 nm (for sub-micron channel length transistors) is formed over the exposed portions of oxide layer 112 and the two islands 117, 118. The oxide layer 121 may be either grown in an oxide furnace or by a deposition of oxide material followed by an anneal. Both of these processes are known in the art.

In a next step, a layer of polysilicon 122 is formed on oxide layer 121, preferably using chemical vapor deposition. The thickness of this layer is approximately 250 to 500 nm. Polysilicon layer 122 is then doped with a high concentration of electron donor atoms which may include phosphorous or arsenic, or the like. Doping of the polysilicon is known in the art and may include ion implantation, diffusion or a combination of the two. Photoresist 125 is then applied to define the gate electrodes of the n-channel and p-channel transistors. Portions of polysilicon layer 122, not protected by photoresist 125, are etched away to form an n-channel gate electrode 128 and a p-channel gate electrode 129, shown in FIG. 3.

Figure 3:
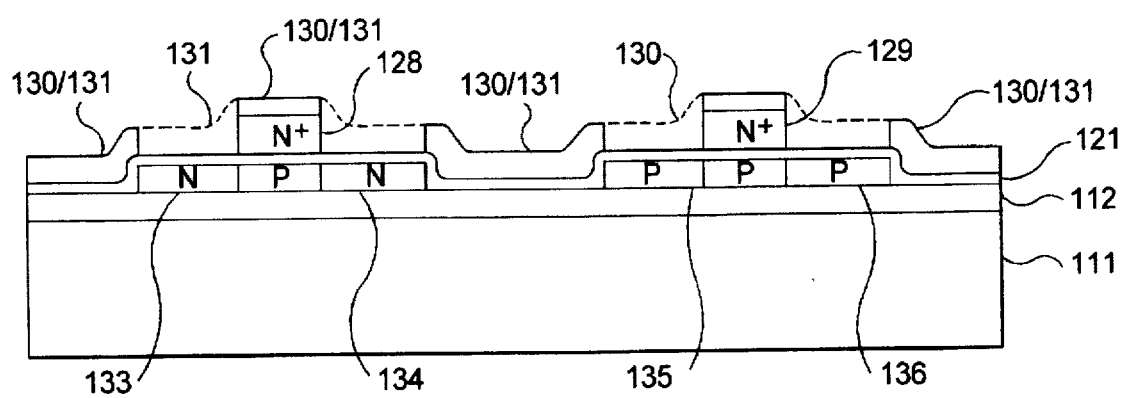

Referring to FIG. 3, steps are taken to define and dope the source and drain regions of the n and p channel transistors. To form the source and drain regions of the n-channel device, photoresist 130 is applied to all those portions of the wafer that will not receive n-type ion doping. Doping is preferably implemented by selectively implanting phosphorous ions to the exposed regions 133 and 134 of Ge—Si island 117. A suitable phosphorous ion implantation is a dose in the order of $1 \times 10^{13}$ ion/cm$^2$ at an energy of approximately 30 to 50 keV. The photoresist is then removed. Similarly, to form the p-channel transistor, a new layer of photoresist 131 is applied to protect those portions of the wafer that will not receive p-type ion implantation. A suitable p-type ion implantation is a boron ion implantation in the order of $1 \times 10^{13}$ ion/cm$^2$ at an energy of 10 to 20 keV. In this manner, the lightly doped source and lightly doped drain regions of the n-channel and p-channel transistors are formed. We will designate regions 133 and 135 as the source regions and regions 134 and 136 as the drain regions, note that this designation is arbitrary.

Figure 4:
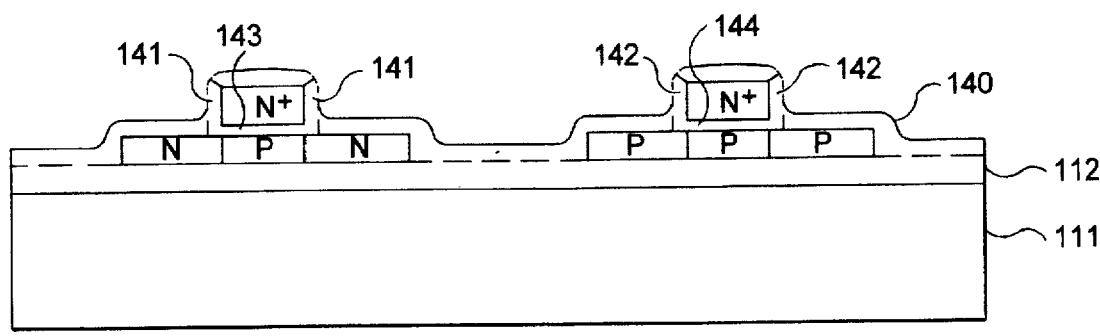

Referring now to FIG. 4, undoped oxide 140 of preferably 50 to 150 nm in thickness is then formed over the device of FIG. 3 (after removing photoresist 130/131). The oxide region 112 is shown separated from the undoped oxide layer 140 by a dashed line because they are essentially the same material. The new oxide layer 140 is preferably formed by chemical vapor deposition. An anisotropic etch is then performed to remove oxide on horizontal surfaces while retaining oxide on vertical surfaces. This process serves to form oxide sidewalls 141 on the n-channel device and 142 on the p-channel device. The vertical sidewalls 141, 142 are used for alignment tolerances and may be used, as described below, to define the lightly doped regions.

Figure 5:
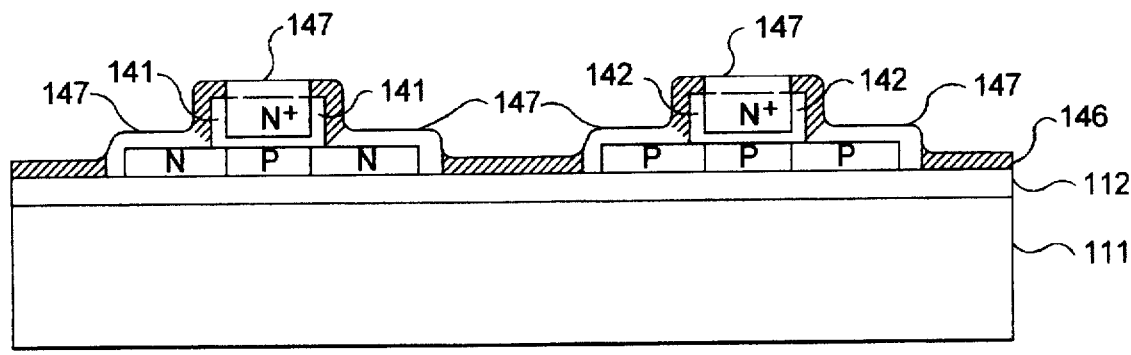

Referring to FIG. 5, a layer of refractory metal 146 which may include cobalt, titanium, zirconium or the like, but is preferably cobalt or titanium is deposited in a thickness of approximately 20 to 100 nm. The deposition of a refractory metal is provided to form silicide which is known to increase the electrical conductivity of a semiconductor material. The increased conductivity brought about by silicide reduces the parasitic time constant, τ, discussed above. Note that silicidation is optional.

After deposition of the metal 146, an anneal of 400° to 650° C. for 10 to 20 seconds in nitrogen ambient is performed. This causes those regions of the metal 147 that are in contact with a semiconductor material, in this case the polysilicon of the gates 128, 129 and the Ge—Si of channel regions 119, 120, to react with these semiconductor materials. The anneal causes the formation of a refractory metal-silicon compound where the refractory metal is relatively uniformly distributed throughout the silicon material but is unstable.

In a next step, the excess refractory metal that did not react with a semiconductor material is etched away. At this time, a second anneal, at approximately 700° to 950° C. for a duration of approximately 10 to 20 seconds or longer could be performed to form silicide from the refractory metal silicon compound. However, in the present invention, a subsequent anneal (described below) is sufficient for refractory metal silicon stabilization and, therefore, an anneal at this time is optional.

Figure 6:
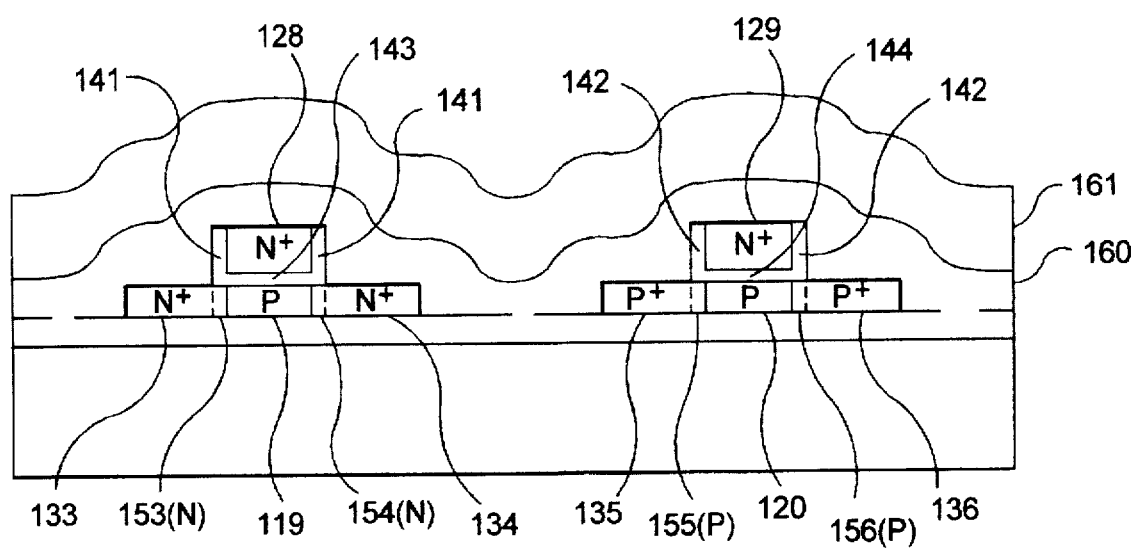

Referring to FIG. 6, after the removal of excess refractory metal, the wafer and n-channel and p-channel transistors appear as shown in FIG. 6 without the additional oxide 160 and BPSG 161 layers. Appropriate photoresist is applied and electron donor impurity ions are implanted into the n-channel device. Suitable ions include phosphorous and arsenic, however, arsenic is preferred because it experiences less lateral diffusion, preserving lightly doped regions 153 and 154 which are created as follows. The sidewalls 141 and 142 serve as masks during the second donor ion implantation (of arsenic ions) which creates heavily doped regions 133, 134, and two smaller lightly doped regions 153 and 154 which are approximately the same width as the sidewalls 141 minus some lateral diffusion. This width may vary due to diffusion during subsequent annealing processes. A suitable dose of arsenic ions for this second implant is approximately $3 \times 10^{15}$ to $1 \times 10^{16}$ ions/cm$^2$ at an energy of 30 to 50 keV. A similar process is carried out for the p-channel device. Appropriate photoresist is applied and then electron acceptor impurity ions, preferably boron ions, are selectively implanted into the source and drain regions 135 and 136. The sidewalls 142 form a mask permitting the creation of lightly doped source region 155 and lightly doped drain region 156. A suitable implantation dose is approximately $5 \times 10^{15}$ to $2 \times 10^{16}$ ions/cm$^2$ at an energy of approximately 10 to 20 keV.

In a next step, approximately 100 to 300 nm of undoped oxide 160, preferably silicon dioxide, is formed over the n and p channel transistors. This oxide layer 160 forms a complete protective envelope of oxide around the n-channel and p-channel devices. Further insulation and protection is provided by 200 to 300 nm of BPSG (boron phospho-silicate glass) 161, which is structurally similar to oxide. The wafer of FIG. 6 is then annealed in order to flow BPSG at 800° to 900° C. for 10 to 20 minutes, to form silicide and to otherwise create a stable device. Note that should the silicide process not be desired, any state of the art CMOS process can be applied to fabricate the semiconductor structure 100 from a point just prior to the deposition of refractory metal to the finished structure of FIG. 7.

After the anneal, any of the known processes to finish the wafer may be used to produce the structure 100 of FIG. 7. This includes, amongst other process steps, forming interconnects to the transistors 101, 102, as is known in the art. The wafer finishing process may be either a single metal layer or multi-metal layer process.

In summary, there has been disclosed a method for fabricating a germanium doped silicon on insulator MOS transistor, comprising the steps of: (a) doping a layer of semiconductor material, comprised substantially of silicon and formed on an insulator material, with germanium ions to increase a channel mobility of said layer; (b) forming a gate oxide on a portion of said germanium doped silicon layer; (c) forming a gate electrode for reception of a gate voltage on said gate oxide; (d) doping said germanium doped silicon layer with one or the other of the P and N dopant impurity types to form source and drain regions within the germanium doped silicon layer such that said source and drain regions are separated and defined by a channel region in said germanium doped silicon layer which is substantially overlaid by said gate oxide; and (e) forming insulator material about said source, drain and channel regions and said gate electrode.

The disclosed method summarized above further comprises the step of forming said substantially silicon layer on said insulator material utilizing shallow SIMOX process technology.

The utilization of the shallow SIMOX process technology includes the steps of: (a) providing a substantially silicon substrate; (b) implanting oxygen ions into said silicon substrate at a dose of approximately $1 \times 10^{17}$ ions/cm$^2$ to $5 \times 10^{17}$ ions/cm² at low energy of approximately 30 to 60 keV; and (c) annealing said implanted substrate to form a layer of single crystal silicon over a layer of silicon dioxide insulator material wherein the doping with germanium ions is performed to obtain 10 to 30% concentration of germanium in silicon.

The disclosed method summarized above further comprises the step of metallizing the source and drain regions wherein the metallizing step comprises the steps of: (a) depositing a refractory metal onto said source and drain regions; (b) heating said deposited metal and said source and drain regions to bring about a reaction between said source and drain regions and said metal and a diffusion of said metal into said source and drain regions; (c) etching said deposited refractory metal that has not reacted with semiconductor material in said source and drain regions; and (d) annealing said source and drain regions after diffusion of said refractory metal to stabilize the source and drain regions.

The disclosed method summarized above further comprises the steps of: (a) doping, in a first doping step, said source and drain regions with a low concentration of said dopant ions of said one or the other of the P and N conductivity types; and (b) doping, in a second doping step, a portion of said source and drain regions which is less than that doped in said first doping step with said dopant ions to form a lightly doped and a heavily doped region in each of said source and drain regions.

While the invention has been described in connection with specific embodiments thereof, it will be understood that it is capable of further modification, and this application is intended to cover any variations, uses, or adaptations of the invention following, in general, the principles of the invention and including such departures from the present disclosure as come within known or customary practice in the art to which the invention pertains and as may be applied to the essential features hereinbefore set forth, and as fall within the scope of the invention and the limits of the appended claims.

What is claimed is:

1. A Ge—Si MOS transistor comprising:
   (a) an insulator layer;
   (b) an active layer extending over said insulator layer, said active layer being composed of germanium doped silicon and having a single crystal structure, the active layer including source, channel and drain regions of said transistor, at least the channel region extending fully across said insulator layer, wherein said source, channel and drain regions have a same germanium concentration:
   (c) a gate oxide layer extending over said active layer; and
   (d) a gate electrode extending over said gate oxide layer, and further extending over said channel region of said active layer.

2. A Ge—Si MOS transistor according to claim 1 wherein said active layer consists essentially of 70 atomic percent or more silicon and 30 atomic percent or less germanium.

3. A Ge—Si MOS transistor according to claim 1 wherein said active layer consists essentially of 70 to 90 atomic percent silicon and 30 to 10 atomic percent germanium.

4. A Ge—Si MOS transistor according to claim 1 wherein said channel region is doped to be of a first conductivity type and said gate electrode includes silicon doped to be of an opposed second conductivity type.

5. A Ge—Si MOS transistor according to claim 4 wherein said channel region is doped to have a P-type conductivity and said gate electrode is more heavily doped to have an N-type conductivity.

6. A Ge—Si MOS transistor according to claim 5 wherein said transistor is a P-channel device having P-doped source and drain regions.

7. A Ge—Si MOS transistor according to claim 5 wherein said transistor is a N-channel device having N-doped source and drain regions.

8. A Ge—Si MOS transistor according to claim 1 wherein at least one of said source and drain regions includes a lightly doped subregion adjacent to said channel region and a more heavily doped subregion spaced away from said channel region.

9. A Ge—Si MOS transistor according to claim 8 wherein each of said source and drain regions includes a lightly doped subregion adjacent to said channel region and a more heavily doped subregion spaced away from said channel region.

10. A Ge—Si MOS transistor according to claim 8 wherein:
    said gate electrode has one or more insulative sidewalls formed at a respective one or more sides of said gate electrode; and
    said lightly doped subregion of said at least one source/drain region is self aligned to an overlying insulative sidewall of said gate electrode.

11. A Ge—Si MOS transistor according to claim 1 wherein at least one of said gate electrode, source region and drain region includes a silicidized contact surface.

12. A Ge—Si MOS transistor according to claim 1 further comprising:
    a protective envelope of insulative material covering said gate electrode, source region and drain region and extending to said insulator layer.

13. A Ge—Si MOS transistor comprising:
    (a) an insulator layer located on a monocrystalline substrate;
    (b) a monocrystalline layer composed of silicon that is homogeneously doped with germanium, said monocrystalline layer being located on said insulator layer, said monocrystalline layer having formed therein a source region, a channel region and a drain region of said transistor, each of said source, channel and drain regions being insulated from said substrate by the insulator layer;
    (c) a gate oxide layer disposed on said monocrystalline layer to extend fully across said channel region; and
    (d) a gate electrode formed on said gate oxide layer over said channel region of said monocrystalline layer.

14. A Ge—Si MOS transistor according to claim 13 wherein said source region and said drain region each includes a lightly doped subregion adjacent to said channel region and a more heavily doped subregion spaced away from said channel region.

15. A Ge—Si MOS transistor according to claim 14 wherein:
    said gate oxide layer extends over said source region and said drain region such that each said lightly doped subregion is located beneath said gate oxide layer.

16. A SIMOX device comprising:
    (a) an insulator layer having opposed first and second sides;
    (b) a semiconductive substrate layer provided on said first side of the insulator layer;
    (c) a semiconductive active layer provided on said second side of the insulator layer so as to be substantially spaced apart from said semiconductive substrate layer, (c.1) wherein said active layer is composed of silicon homogeneously doped with germanium, (c.2) wherein said active layer has a single crystal structure, and (c.3) wherein said active layer includes a first source region, a first channel region and a first drain region of a respective first transistor;

(d) a first gate electrode of said first transistor extending over the respective first channel region; and (e) a gate oxide layer provided on said active layer interposed between the first gate electrode and the first channel region.

17. A SIMOX device according to claim 16 wherein:

(a.1) said insulator layer is composed of silicon dioxide.

18. A SIMOX device according to claim 16 wherein:

(b.1) said semiconductive substrate layer has a single crystal structure.

19. A SIMOX device according to claim 16 wherein:

(c.4) said active layer has a thickness of approximately 60 nm or less.

20. A SIMOX device according to claim 19 wherein:

(a.1) said insulator layer has a thickness of about 50 nm or more.

21. A SIMOX device according to claim 20 wherein:

(a.2) said insulator layer has a thickness approximately equal to the thickness of the active layer.

22. A SIMOX device according to claim 21 wherein:

(e.1) said gate oxide layer is thermally grown and has a thickness of approximately 5 to 12 nm.

23. A SIMOX device according to claim 16 wherein:

(c.4) said active layer further includes a second source region, a second channel region and a second drain region of a respective second transistor; and (c.5) said first channel region is doped to have a first conductivity type to define a respective first threshold voltage level for said first transistor and said second channel region is doped to have a same first conductivity type but to define a different second threshold voltage for said second transistor.

24. A SIMOX device according to claim 23 wherein:

(c.6) said first source and drain regions are doped to have a second conductivity type opposite to said first conductivity type; and (c.7) said second source and drain regions are doped to have said first conductivity type.

25. A SIMOX device according to claim 24 wherein:

(c.8) said second transistor includes a second gate electrode extending over the respective second channel region; and (d.1) each of the first and second gate electrodes is composed of semiconductive material doped to have said second conductivity type.

26. A SIMOX device according to claim 16 wherein:

(c.4) said first source, channel and drain regions have substantially coplanar top surfaces, the top surface of the first channel region being covered by said gate oxide layer, and (c.5) the respective top surfaces of the first source region and the first drain region include a silicide.

27. An integrated circuit comprising:

(a) a bulk substrate region;

(b) a first insulator composed of first noncrystalline insulating material and disposed on said bulk substrate region;

(c) a monocrystalline silicon germanium region having a homogeneous concentration of germanium disposed on said first insulator and insulated by said first insulator from the bulk substrate region; and (d) a second insulator composed of second noncrystalline insulating material thermally-grown from and insulating said monocrystalline silicon germanium region such that the monocrystalline silicon germanium region is sandwiched between said first and second insulators.

28. An integrated circuit according to claim 27 further comprising:

(e) a polycrystalline silicon section disposed on and insulated by said second insulator.

29. An integrated circuit according to claim 28 further comprising:

(f) a third insulator composed of third noncrystalline insulating material and disposed about and insulating said polycrystalline silicon section, the third insulator extending from said second insulator.

30. An integrated circuit according to claim 29 wherein:

(e.1) said polycrystalline silicon section defines a gate electrode of a first transistor; and (c.1) said monocrystalline silicon germanium region defines a channel region, a source region and a drain region of said first transistor.

31. An integrated circuit according to claim 29 wherein the first transistor source and drain regions are of a first conductivity type and said integrated circuit further comprises:

(g) a second transistor having source and drain regions of a second conductivity type that is complementary to said first conductivity type;

wherein the second transistor includes a respective second monocrystalline silicon germanium region of homogeneous germanium concentration defining a channel region, a source region and a drain region of said second transistor.

32. An integrated circuit according to claim 28 wherein:

(e.1) said polycrystalline silicon section is formed on the second insulator by chemical vapor deposition.

33. An integrated circuit according to claim 27 wherein:

(b.1) said first insulator is formed by oxygen ions implanted into silicon.

* * * * *